(12) United States Patent
Wallace

(10) Patent No.: US 7,939,920 B2
(45) Date of Patent: May 10, 2011

(54) MULTIPLE DIE INTEGRATED CIRCUIT PACKAGE

(75) Inventor: Robert F. Wallace, Ft. Myers, FL (US)

(73) Assignee: SanDisk Corporation, Milpitas, CA (US)

( * ) Notice: Subject to any disclaimer, the term of this patent is extended or adjusted under 35 U.S.C. 154(b) by 309 days.

(21) Appl. No.: 12/203,496

(22) Filed: Sep. 3, 2008

(65) Prior Publication Data
US 2008/0315382 A1 Dec. 25, 2008

Related U.S. Application Data

(62) Division of application No. 11/264,112, filed on Nov. 1, 2005, now Pat. No. 7,511,371.

(51) Int. Cl.
*H01L 23/495* (2006.01)

(52) U.S. Cl. ............... 257/676; 257/E23.039; 257/666; 257/686; 438/123

(58) Field of Classification Search ........... 257/E23.031, 257/E23.039, E23.042, E23.052, E25.013, 257/676, 666, 686, 690, 692, 700, 724, 774, 257/736, 748, 926; 438/106, 123, 629
See application file for complete search history.

(56) References Cited

U.S. PATENT DOCUMENTS

| | | | |
|---|---|---|---|
| 4,288,841 A | 9/1981 | Gogal | |
| 4,423,468 A | 12/1983 | Gatto et al. | |
| 5,147,815 A | 9/1992 | Castro | |
| 5,220,195 A | 6/1993 | McShane et al. | |
| 5,239,198 A * | 8/1993 | Lin et al. | 257/693 |
| 5,438,224 A * | 8/1995 | Papageorge et al. | 257/777 |
| 5,715,193 A | 2/1998 | Norman | |
| 5,798,564 A * | 8/1998 | Eng et al. | 257/686 |
| 5,801,072 A | 9/1998 | Barber | |
| 5,861,668 A * | 1/1999 | Cha | 257/692 |
| RE36,077 E * | 2/1999 | Michii et al. | 351/813 |
| 5,880,403 A | 3/1999 | Czajkowski et al. | |
| 6,051,878 A | 4/2000 | Akram et al. | |

(Continued)

FOREIGN PATENT DOCUMENTS
DE 19522338 A1 1/1997
(Continued)

OTHER PUBLICATIONS
Office Action dated Mar. 9, 2010, Korean Application No. 7013254/2008.
(Continued)

*Primary Examiner* — Chris Chu
(74) *Attorney, Agent, or Firm* — Vierra Magen Marcus & DeNiro LLP

(57) ABSTRACT

A multiple die package and removable storage card is disclosed. An insulator layer is provided and one or more vias are formed within it. The insulator may be provided without vias, and vias formed later. At least one integrated circuit is provided and electrically coupled to at least one lead of a first leadframe overlying one surface of the insulator layer. At least one second integrated circuit is provided and electrically coupled to a second leadframe overlying a second surface of the insulator layer. Electrical connections between the two leadframes and the first and second integrated circuits are made through the insulator, at selected locations, by coupling at least one lead of the first and second leadframes one to another. The leads of the first and second leadframe may be electrically coupled via anisotropically conductive areas of the leadframes.

18 Claims, 11 Drawing Sheets

U.S. PATENT DOCUMENTS

| | | | | |
|---|---|---|---|---|
| 6,069,025 | A | * | 5/2000 | Kim .................. 438/109 |
| 6,079,987 | A | | 6/2000 | Matsunaga et al. |
| 6,080,931 | A | * | 6/2000 | Park et al. ............. 174/534 |
| 6,137,164 | A | * | 10/2000 | Yew et al. ............. 257/686 |
| 6,153,928 | A | | 11/2000 | Cho |
| 6,239,496 | B1 | | 5/2001 | Asada |
| 6,291,892 | B1 | * | 9/2001 | Yamaguchi ............. 257/778 |
| 6,313,598 | B1 | | 11/2001 | Tamba et al. |
| 6,316,825 | B1 | | 11/2001 | Park et al. |
| 6,410,355 | B1 | | 6/2002 | Wallace |
| 6,413,798 | B2 | * | 7/2002 | Asada ................... 438/108 |
| 6,448,636 | B2 | * | 9/2002 | Suenaga et al. ......... 257/678 |
| 6,462,421 | B1 | * | 10/2002 | Hsu et al. ............. 257/777 |
| 6,472,732 | B1 | * | 10/2002 | Terui ................... 257/678 |
| 6,521,483 | B1 | | 2/2003 | Hashimoto |
| 6,603,197 | B1 | | 8/2003 | Yoshida et al. |
| 6,639,309 | B2 | | 10/2003 | Wallace |
| 6,690,564 | B1 | * | 2/2004 | Haruta et al. ........... 361/212 |
| 6,693,346 | B2 | | 2/2004 | Masayuki et al. |
| 6,753,207 | B2 | * | 6/2004 | Hur ..................... 438/109 |
| 6,774,473 | B1 | * | 8/2004 | Shen .................... 257/686 |
| 6,815,251 | B1 | * | 11/2004 | Akram et al. ........... 438/107 |
| 6,841,876 | B2 | * | 1/2005 | Haruta et al. ........... 257/741 |
| 6,872,903 | B2 | | 3/2005 | Takenaka et al. |
| 6,951,982 | B2 | * | 10/2005 | Chye et al. ............. 174/350 |
| 7,170,158 | B2 | * | 1/2007 | Choi et al. ............. 257/686 |
| 2002/0084522 | A1 | | 7/2002 | Yoshizawa |
| 2002/0121690 | A1 | | 9/2002 | Masayuki et al. |
| 2004/0089717 | A1 | | 5/2004 | Harari et al. |
| 2004/0169285 | A1 | | 9/2004 | Verma et al. |
| 2006/0102995 | A1 | | 5/2006 | Tsai et al. |
| 2007/0096265 | A1 | | 5/2007 | Wallace |
| 2007/0096284 | A1 | | 5/2007 | Wallace |
| 2008/0050859 | A1 | | 2/2008 | Wallace |
| 2009/0239340 | A1 | | 9/2009 | Wallace |

FOREIGN PATENT DOCUMENTS

| | | |
|---|---|---|
| DE | 19648492 A1 | 11/1997 |
| EP | 0798772 A | 10/1997 |
| JP | 57063850 A | 4/1982 |
| JP | 03030494 A | 2/1991 |
| WO | 9326144 A | 12/1993 |

OTHER PUBLICATIONS

Taiwanese Office Action and Search Report dated Jun. 15, 2009 in Taiwanese Patent Application No. 095140244.

International Search Report dated Jul. 9, 2007 in PCT Application No. PCT/US2006/042450.

"FCBGA (Flip Chip Ball Grid Array)", 1995 NEC Electronics Corporation, Feb. 6, 2007, http://www.necel.com/pkg/en/pk02_03.html.

Office Action dated Apr. 10, 2007, U.S. Appl. No. 11/264,556, filed Nov. 1, 2005.

Office Action dated Apr. 27, 2007, U.S. Appl. No. 11/264,112, filed Nov. 1, 2005.

Office Action dated Feb. 23, 2007, U.S. Appl. No. 11/264,112, filed Nov. 1, 2005.

Office Action dated Oct. 16, 2007, U.S. Appl. No. 11/264,556, filed Nov. 1, 2005.

Response to Office Action dated Oct. 31, 2007, U.S. Appl. No. 11/264,556, filed Nov. 1, 2005.

Response to Office Action dated Aug. 27, 2007, U.S. Appl. No. 11/264,112, filed Nov. 1, 2005.

Response to Office Action dated Aug. 10, 2007, U.S. Appl. No. 11/264,556, filed Nov. 1, 2005.

Notice of Allowance dated Nov. 9, 2007, U.S. Appl. No. 11/264,556, filed Nov. 1, 2005.

*Ex Parte Quayle* Office Action dated Nov. 19, 2007, U.S. Appl. No. 11/264,112, filed Nov. 1, 2005.

Response to *Ex Parte Quayle* Office Action filed Jan. 22, 2008, U.S. Appl. No. 11/264,112, filed Nov. 1, 2005.

Notice of Allowance dated Mar. 10, 2008, U.S. Appl. No. 11/264,112, filed Nov. 1, 2005.

Notice of Allowance dated Dec. 2, 2008 in U.S. Appl. No. 11/931,092.

Office Action dated Nov. 17, 2010, U.S. Appl. No. 12/430,388.

\* cited by examiner

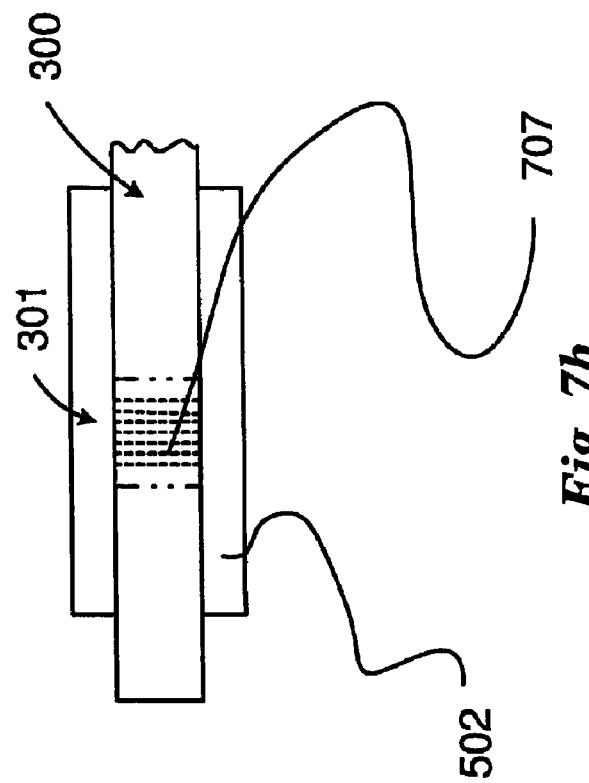
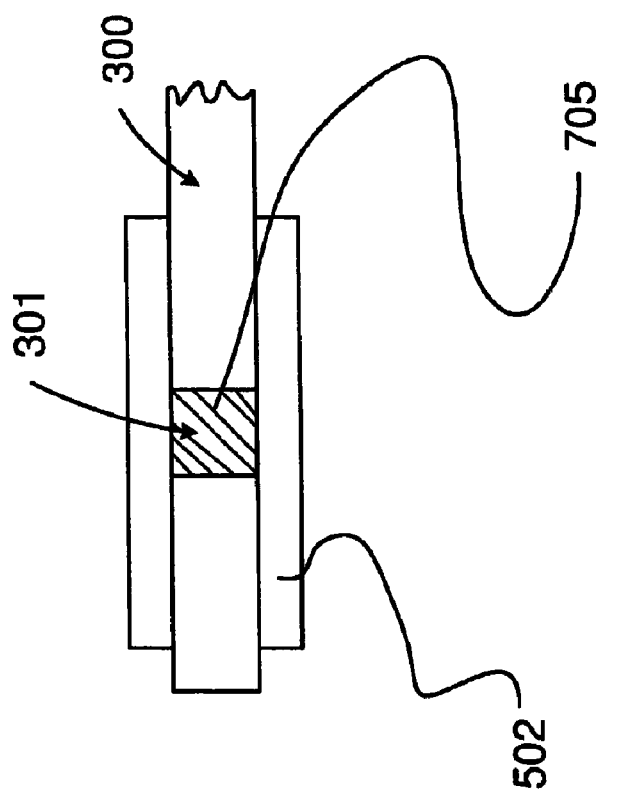
Fig. 7b
Fig. 7a

MULTIPLE DIE INTEGRATED CIRCUIT PACKAGE

CLAIM OF PRIORITY

This application is a divisional application of U.S. patent application Ser. No. 11/264,112 filed on Nov. 1, 2005 entitled "Multiple Die Integrated Circuit Package", which application is incorporated herein by reference.

TECHNICAL FIELD

The present invention and the various embodiments described generally relate to the fabrication of packaged semiconductor devices including more than one integrated circuit device, and more particularly to fabricating packages with multiple integrated devices to form a packaged system, memory or memory card storage device.

BACKGROUND

In the electronics arts, semiconductor devices are provided in packages that protect and provide external connections to the integrated circuits. The need for integration and advanced functionality of the devices has resulted in multiple integrated circuits, sometimes called chips or dies, being provided in a single package. The package can be formed in various ways and of various materials, including molded packages formed from thermosetting or thermally cured material, e.g., "glob top" or epoxy packages, pre-formed plastic or ceramic or metallic bodies and the like. The materials used protect the small and brittle semiconductor integrated circuits, or "dies", from physical and some degree of moisture damage, and provide protections for the conductive leads or wires used to couple the external terminals, typically metallic or other conductive contacts, to the conductive bond pads on the integrated circuits, which are the external electrical connections of the integrated circuits.

Often, leadframes are used in the semiconductor packaging art, to provide mechanical support and to make electrical connections between the integrated circuits and the exterior electrical contacts or leads of the packaged device. Leadframes consist of conductive material, often copper or an alloy, or an iron nickel alloy such as Alloy 42, which are often coated to increase conductivity and solderability with materials such as gold, ruthenium, palladium, and the like, and additional coatings or alloys of nickel, copper, or other materials may be used to improve solderability and the manufacturability of connections. Plastic coatings over conductive material may be used to form a leadframe. Leads may be soldered or plated for soldering prior to assembly, or after assembly of the completed package. The leadframes are usually provided in an integrated strip form, and may be etched or stamped out, the leadframe strips are several leadframes connected in a strip form for ease of assembly and manufacture, and are then separated at a later stage of manufacture.

The leadframe typically provides a plurality of leads, often finger-shaped, although other shapes are used, which extend from outside an area that will be the exterior boundary of the desired finished package to an interior area arranged to receive an integrated circuit. In the prior art, it is known to use an arrangement where one area of the leadframe provides a central support, called a "die pad", for receiving the rectangular or square semiconductor die, and the lead fingers extend on one or more sides of the die pad to an area proximate to the outside edges of the integrated circuit die. The leadframe fingers are positioned extending away from the die and through the planned exterior boundary of the encapsulated package. In other arrangements of the prior art, the lead fingers may extend over the die (lead on chip or "LOC" type leadframes) or under the die (lead under chip or "LUC" type leadframes) with the leads providing mechanical support, as well as electrical paths.

Insulator adhesive in the form of coatings or tapes can be used to secure the die to the leads, or to stabilize the leads by securing the leads together and maintaining their position during the assembly process. The die may be adhered to a die pad using a die attach adhesive, which may be conductive or insulating material and may be a resin or thermosetting material.

Regardless of the type of leadframe used, it is necessary to provide coupling mechanisms to electrically couple the integrated circuit to the leadframe. Typically, bond wires are used. These miniature wires are applied to the semiconductor device by a wire bonding process; the wire is typically dispensed as it is applied through a capillary. The wire bonding process uses heat and pressure and sometimes other energies, such as ultrasonic energy, to form a bond by attaching a wire to the integrated circuit bond pad, and then extends the bond wire above and away from the integrated circuit and to an area above the end of a lead finger of the leadframe, then the capillary again uses heat and pressure to form a second connection of the bond wire to the leadframe. Alternatively, the bond wire could be formed in a vice versa direction, attaching first to the leadframe finger and extending up to and above the integrated circuit and attaching to a bond pad. The cut wire is often heated to form a ball on the end of the bond wire, which is then used for the next bond to the integrated circuit die ("ball" bonding), the end of the bond wire which is attached to the lead frame without a ball may be called the "stitch". If required, multiple bond wires can extend from different pads of the integrated circuit to a single lead of the leadframe, for example, power or ground connections for the integrated circuit may be made in this manner. The bond wire may be a gold or other known conductor material that is malleable and flexible enough to allow for this type of handling and which is useful for the ball and stitch bonding steps without unwanted breakage. The wire bonding process may be highly automated, and is typically performed at a very high rate of speed.

In the assembly process, after the integrated circuit die is wire bonded to the leadframe, the leadframe and die may be placed in molding equipment, for example in a transfer molding machine, where liquid or molten mold compound material is dispensed to encapsulate the leadframe and integrated circuit together, so as to provide mechanical protection and some degree of moisture resistance to the die as described above. Other alternatives include using injection molding, epoxies and resins, such as "glob top" materials and other known materials for integrated circuit encapsulation may be used. In lieu of molding, the leadframe and die assembly may instead be installed into a ceramic, metallic or plastic body which may then be subsequently sealed by encapsulant, using lids and adhesives, or otherwise. The external ends of the leads of the leadframe may themselves form the external contacts of the packaged device, such as in a DIP, quad flat pack, SOP, or other leaded package, or additional connectivity technologies may be used, such as in a ball grid array ("BGA") or pin grid array ("PGA") package and the like. Leadframes may be used in combination with other interconnection interposer technologies, such as printed circuit boards, flexible circuits based on film based materials, commercially available films used in semiconductor manufacture, such as Kapton, Upilex, Mylar and the like, or ceramic substrate materials may be used. To make complex substrate arrangements possible in the prior art, multiple layer interposers are often used with metal layers formed coupling external connectors to the integrated circuits. For example, a terminal on the bottom surface may be coupled to the leadframe or wire bonding land terminals on the upper surface of the interposer through multiple layers and vias in the substrate or interposers. These interposers or substrates are typically laminated structures with insulator layers formed over various conductive layers. Once the assembly is completed, these laminates may be overmolded to provide a hermetically sealed packaged device or the assembly may be placed in a body that is sealed.

As the need for increased integration in packaged devices continues, it is also known in the art to provide a MCM, or multiple chip module, in which more than one integrated circuit die is provided within a packaged device. For example, a memory device and a controller may be packaged together to form such a module. A processor and memory may form a module as well. These devices may alternatively be identical devices, for example to form a large memory integrated circuit such as commodity DRAM or nonvolatile memory device, multiple identical dies may be placed in one package, with the common terminals of such devices coupled together in parallel to external contacts of the package.

In order for the multiple integrated circuits to be coupled together in a system configuration, various techniques are used. Flex circuits may be formed, which have metallization patterns provided on one or both sides of a flexible substrate, these then act as interconnect levels for connecting the two integrated circuits together. Laminates, such as FR-4 or BT resin cards, can be formed with multiple metal layers and interlevel via technology, these laminate interposers again act as a miniature circuit board for connecting the integrated circuits together and provide traces for external connectivity, such as terminals.

When identical devices are to be coupled together to increase integration, for example as in the case of DRAM devices, die stacking may be used. Bond wires may be extended from the leads of a leadframe to several dies, for example the address leads of a DRAM package may be wired to several DRAM integrated circuits that are stacked. Stacking of dies may include spacers between the dies to enable the wire bonding equipment to access the die pads of the individual stacked integrated dies.

When identical devices are to be coupled together to increase integration, for example as in the case of DRAM devices, die stacking may be employed. Various methods can be used such as providing multiple dies in a "face up" arrangement, and wire bonding may be formed to couple each die to a common leadframe using bond wires to couple them in parallel. It is known to place the dies in a back-to-back relation on leadframe, however, in order to maintain a common bond pad footprint, when a back-to-back relation is used, a "mirror die" is often required, so that the terminals on one side of the die facing upwards will be located in the same position and order as on the corresponding die facing downwards. The need for a "mirror die" greatly increases the complexity of manufacture, inventory control and costs, and requires that each packaged device contain two different dies, having the same function. Alternatively, an interposer or laminate circuit could be used to enable the back-to-back positioning of two identical functional die, this laminate interposer also adds cost and complexity to the finished device.

A particular packaged device type of increasing commercial importance in recent years is the removable non-volatile storage card, allowing transfer of data between a variety of electronic devices. This nonvolatile memory or storage card is available in a variety of formats, including Compact FLASH, Secure Digital or SD, mini-SD, Memory Stick, USB drives, Multimedia Card or MMC, and other formats. In order to provide a robust, reliable and stable data storage format, nonvolatile EEPROM or FLASH memory devices are provided along with an intelligent controller in a single packaged device. The intelligent controller provides data error correction and detection, test, cache and redundancy support function so that even though some storage locations within the nonvolatile memory device are expected to fail and do fail during the useful life of the product, the user data is stored and retrieved correctly and the user or system is unaware that some locations within the memory array are no longer used; the intelligent controller replaces these locations with redundant memory locations and maintains a map of the available locations which is used to maintain the proper storage and consistency of the data. To the user system, the device looks like a large memory array, the controller and the automatic error correction features and redundancy support provide user transparent automatic memory control operations which does not affect the use of the device. These removable storage cards are used and will continue to be used in many applications where data is stored, particularly for cell phones, digital cameras, digital media storage, such as MP3 music and video for music players, video players, electronic games, personal data assistant or PDA devices, for medical history storage, smart cards, credit cards, and the like.

FIG. 1 depicts the exterior surfaces of a typical removable storage card package. This card may be of the type, for example, as described in U.S. Pat. No. 6,410,355 to Wallace, the inventor of the present application, which is incorporated herein by reference. In FIG. 1a, a contact side of the card, for example a secure digital or SD format card, is depicted with conductive terminals 101 arranged for contacting the integrated circuits within package 100. FIG. 1b depicts the opposing side of the package 100, which has no electrical contacts, but typically carries a label with information, brand name, size of media, and the like for the user's visual inspection and reference. The number of terminals, and the type of connections used, varies with the format, for example for secure digital or SD, the terminals shown in FIG. 1a are typical, and only a few external terminals are used. For compact flash or "CF" cards often used with digital cameras the number of terminals is greater, and the terminals are female receptacles located on one end of the side of the package. The camera or card reader has a socket for receiving the same end of the CF package with male terminals or pins within the socket that enter the corresponding female receptacle when the compact flash card is inserted into the socket, thereby completing the connection. Other connections may be used, for example a USB port may be used as the connection.

The prior art packages for removable storage card devices typically include a complex interposer or substrate in the form of a multiple layer laminate printed circuit board or "PC board", which provides physical support and device-to-device connectivity for the controller integrated circuit and the memory device or devices. The board, which may be of BT resin, FR4, or fiberglass or similar, usually is a laminate structure that incorporates metal layers which are patterned to form conductor traces, vias coupling the various layers for making electrical connections, and lands for wire bonds to couple traces on the surface of the board to integrated circuit dies or other components, packaged or bare die components, which are mounted to the board. Multiple memory devices may be provided, for example side by side or as a stack, or a single memory device may be used, but in any event the storage card as packaged in the prior art is a complex packaged device with at least two devices packaged in it and coupled together. FIG. 2 depicts a typical arrangement in a cross sectional view. In FIG. 2, a storage card 200 of the prior art is illustrated having integrated circuit dies 204 and 205 mounted on the same surface of laminated substrate 208. Bond wires 203 connect bond pads on the active surface, or face, of the integrated circuit dies to conductive areas, or lands 206 on the upper surface of the substrate. Two such bond wires are shown coupling two die pads of the integrated circuits electrically by being connected at land 206, the integrated circuits are thus coupled electrically and may be, for example, a memory and a controller integrated circuit. Die attach material 209 is used to secure the dies 204, 205 to substrate 208. After a conventional semiconductor package assembly process that forms the bond wires 203 and attaches them to the integrated circuit dies 204 and 205 and the lands 206 on the substrate, the bond wires and integrated circuit dies are encapsulated in encapsulant 211, which may be thermosetting or room temperature mold compounds or other encapsulating material. The package is completed with shell 201, which may be plastic, covering the substrate and molded materials. In another approach, U.S. Pat. No. 6,639,309 to Wallace, the inventor of the present invention, also incorporated herein by reference, depicts a removable storage card incorporating a memory device and a controller device on opposing surfaces of a multilayer PC board material, with wire bonding connections, and an overmolding encapsulation.

Other approaches to packaging semiconductor integrated circuits may incorporate multiple leadframes or multiple level leadframes that are coupled together. For example, U.S. Pat. No. 5,147,815 to Casto, which is incorporated herein by reference, depicts two integrated circuit dies and two leadframes assembled and provided in a single molded dual inline plastic or "DIP" package. The integrated circuit dies and their respective leadframes are arranged in back-to-back relation and each die is coupled to the respective leadframe by the use of bond wires, or alternatively, the integrated circuits are arranged in a face-to-face relation on opposing sides of an interposer and coupled to their respective leadframe in a flip-chip arrangement, the two integrated circuits are independently coupled to external leads arranged on opposing sides of the packaged device and are not in electrical communication with each other. U.S. Pat. No. 6,603,197 to Yoshida et al., also incorporated herein by reference, provides multiple leadframes coupled to at least two different integrated circuit devices, which are coupled to various leads of the leadframes to form a module, with some common leads being physically and electrically coupled together at the exterior of the package, for example a power lead, so that both integrated circuit devices may receive the signal. Similarly, U.S. Pat. No. 6,316,825 to Park et al., also incorporated herein by reference, provides a stacked package for stacking two identical integrated circuit devices, such as memory devices, in a molded package with two leadframes, which are physically coupled at the exterior of the package, such that each signal coupled to the external leads is physically and electrically coupled to each of the two identical memory devices, which are connected in parallel fashion.

Other arrangements known in the art provide a single integrated circuit coupled to multiple level leadframes, for example, U.S. Pat. No. 5,220,195 to McShane, also incorporated herein by reference, provides a single integrated circuit wire bonded to a multilayer leadframe and includes physical connections between parts of the multiple layer leadframes within the package, and, through-hole vias formed with bond wires extending into the vias to make physical contact to leadframe layers positioned beneath the integrated circuit, thereby enabling the formation of multiple voltage planes within the packaged device.

Although prior art packages for multiple integrated circuits exist, there is a continuing need for multiple die packages that provide reduced costs of production while maintaining the reliability of the package.

A need thus exists for an improved multiple integrated circuit package and a method for packaging multiple integrated circuits that is simple and reliable, allows for arbitrary connections between various integrated circuit devices, does not require expensive interposers, printed circuit boards, or substrates, and is less costly to manufacture than the existing packages and methods.

SUMMARY OF THE INVENTION

Various preferred embodiments of the present invention provide a package for multiple semiconductor integrated circuits or dies, which connects two or more of the integrated circuits electrically, provides mechanical support for the integrated circuits, provides the facility to make arbitrary connections between the integrated circuits, and provides electrical connectivity to external connections of a packaged device. The packages of the invention do not require an interposer or substrate of type used in the prior art, and the materials use conventional wire bonding and leadframe technologies compatible with existing equipment and automated factory machines known in the semiconductor processing industry; such that no retooling or specialized equipment are required to use and implement the invention.

In a first embodiment of the invention, a first leadframe is provided and positioned overlying a simple insulator layer. The insulator layer has vias that are openings formed in certain locations and some leads of the leadframe overlie the vias. Other leads of the leadframe may extend to the external boundary of the insulator or beyond the edge of the insulator. Some leads of the leadframe may not be extended to the external connectors. A first integrated circuit die is provided and positioned in proximity to the interior ends of the leadframes, in some embodiments the leadframe may have an opening provided in the interior and the die may be placed in the interior opening. In other embodiments, the die may rest over the leads of the leadframe, or under the leads of the leadframe. In a preferred embodiment, the die is wire bonded to the leadframe to electrically connect one or more of the leads of the integrated circuit to the leads of the leadframe. In other preferred embodiments, the leads of the leadframe may be connected to the die using flip chip technology as is known in the art.

A second leadframe is then placed overlying the second and opposing surface of the insulator. Certain leads of the second leadframe are positioned overlying the through-hole vias of the insulator as for, and in correspondence with, certain leads of the first leadframe. Other leads of the second leadframe may extend to the exterior of the insulator layer for making external electrical connections to the completed device, and may extend beyond the exterior boundary of the insulator. A second integrated circuit die is placed in proximity to the interior leads of the second leadframe. The second leadframe may have a space in the central portion adjacent the interior ends of the leads of the leadframe for receiving the die, or a lead under chip or lead over chip leadframe arrangement may be used. An electrical connection, such as a bond wire connection or flip chip connection, is made from a die pad terminal on the second integrated circuit to at least one of the leads of the second leadframe. In a typical application there are several and sometimes many bond wires extending from the integrated circuit to the leadframe. Alternately, the first and second leadframe may be attached to each other prior to either die being attached to its corresponding leadframe.

Advantageously, certain leads of the first and second leadframe are electrically coupled through the vias in the insulator. This aspect of the invention makes it possible to electrically couple the first and second integrated circuit dies in an arbitrary location through the facility of making an electrical connection between the two leadframes through the insulator. In a first preferred embodiment, the connection may be made by physically deforming the leadframe leads of the first and second leads into the space within the via in the insulator, and then making a physical contact between the two leads within the via. In a preferred embodiment, a conductive weld is then made between the two leadframes. The weld can be made, for example, with energy applied by heat, electrical energy, ultrasonic energy, laser energy, and the like. In other preferred embodiments, the electrical connections may be made between the two leadframes by providing conductive materials positioned within the via, such as a conductive paste that acts as an electrical connection and which connection may be completed using thermal or electrical energy.

In other preferred embodiments, the insulator may be formed of an anisotropically conductive material that initially acts as an insulator in all directions, but becomes selectively conductive in a vertical direction when pressure or thermal energy or both is applied in an area, while remaining an insulator in the planar directions. In general, a via is a region in which electrical conductivity is achieved between a conductor adjacent to the top surface of the insulator and a conductor adjacent to the bottom surface of the insulator.

The integrated circuit dies may be positioned overlying opposing surfaces of the insulator, such that the integrated circuit dies may be in back-to-back relation. Unlike the back-to-back arrangements of the prior art, no mirror die is required when using the invention, because the method of forming electrical connections through the insulator provided by the invention, allows the arbitrary connections of the terminals of the two devices. It is not required that the terminals of the two integrated circuit dies be aligned or mirrored, as for some of the prior art packages.

Further, the integrated circuit dies may, in some embodiments, be identical as for DRAM, EEPROM, FLASH or other dynamic or nonvolatile memory devices, where a larger packaged device may be created by coupling multiple identical integrated circuit dies together. In other preferred embodiments, the dies may have different functions such as a memory controller and a memory device, an analog circuit and a digital device, a sensor and a controller device, and the like, to provide for integrated functions in the completed packaged device.

In alternative preferred embodiments, the invention may provide an insulator with vias formed in selected locations, a first leadframe overlying one surface of the insulator layer, a second leadframe overlying the opposing insulator layer, a first integrated circuit coupled to the first leadframe using known flip chip technology, where the integrated circuit bond pads are positioned in physical proximity to the desired leads and balls or pads of solder are formed, which are then reflowed using energy to form a mechanical and electrical connection between the die pads and the interior of the leads; the second integrated circuit may likewise be coupled to the second leadframe using flip chip technology, as before the completed device has electrical connections made between the first and second integrated circuits through the vias in the insulator. Since the first and second dies in this preferred embodiment are both coupled to the leadframe using flip chip technology, the integrated circuit devices may be arranged in face-to-face relation.

Alternative embodiments, which are contemplated within the invention and the appended claims, include combining flip chip connection and wire bonding connection so that one die may be coupled to a first leadframe using flip chip technology, and the second die may be coupled to the second leadframe using wire bonding, for example.

In another preferred embodiment, a removable storage card is formed using the packaging apparatus and methods of the invention; an insulator layer is provided with vias formed in selected locations, a first leadframe is positioned overlying the insulator and having some leads overlying the vias in the insulator, a first integrated circuit, which is a nonvolatile memory device, is positioned in proximity to the first leadframe and at least one electrical connection is made between the nonvolatile integrated circuit and the leadframe, a second integrated circuit is provided in proximity to a second leadframe, which is positioned overlying the opposing surface of the insulator and having some leads, which overlie the vias in the insulator, the second integrated circuit being a controller circuit for operating the nonvolatile memory device, the second integrated circuit is electrically connected to the second leadframe.

Electrical connections are made between the memory controller circuit and the nonvolatile memory, by forming electrical connections between the first and second leadframes through the vias in the insulator using the methods of the present invention. The storage card may be completed by overmolding or encapsulating the insulator, the first and second integrated circuit, and portions of the first and second leadframe, the remaining exterior portions of which are used to form the external connections for the completed storage card.

Advantageously, the insulator used in the preferred embodiments of the present invention may comprise a variety of known materials. Because no electrical connections, complex multilayer routing, or metallization patterns are required within or on the insulator, the insulator may be formed of any material which electrically insulates the first and second leadframe one from another and which also may have throughhole vias formed within it. Plastic, glass, ceramic, fiberglass, resin, PC board, tapes, films, papers and other insulators may be used. Chemical etching, photolithography, laser drilling, or mechanical drilling processes may form the vias. Plastic or resin molding may be used to form an insulator with vias formed in it. The insulator can be formed in a wide variety of thicknesses and may be rigid or flexible material as desired. The insulator may be overmolded to complete the packaged device, alternatively the insulator, integrated circuit and leadframe assembly may be positioned in the cavity of a shell or within a preformed body structure, which is subsequently sealed with adhesives or sealants using lids or layers.

In another preferred embodiment, an integrated system may be provided in a single package by incorporating multiple integrated circuit dies on either side of an insulator, the multiple dies being wire bonded to leadframes, which are coupled through vias in the insulator to make arbitrary connections between the integrated circuits, wherein the packaged assembly for the system includes passive elements, such as resistors, capacitors, or inductors. The entire assembly can then be overmolded into a completed packaged system being provided using the methods of the invention.

Advantages of embodiments of the present invention include providing apparatus and methods of forming multiple integrated circuit modules including multiple integrated circuit devices which are electrically coupled to each other without the need for the complex interposers, flex circuits, laminate substrates or patterned printed circuit boards of the prior art, using conventional wire bonding or flip chip technologies and package molding methods, which are compatible with existing tooling, and using materials compatible with the existing automated semiconductor packaging infrastructure.

The foregoing description has outlined rather broadly the features and technical advantages of embodiments of the present invention in order that the detailed description of the invention that follows may be better understood. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, which are representative illustrations provided for ease of understanding and are not drawn to scale, in which:

FIGS. 7a, 7b depict in a cross-section additional preferred embodiments of the insulator layer of the present invention;

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

The operation and fabrication of the presently preferred embodiments are discussed in detail below. However, the embodiments and examples described are not the only applications or uses contemplated for the invention. The specific embodiments discussed are merely illustrative of specific ways to make and use the invention, and do not limit the scope of the invention. The figures are for illustrative purposes and are not drawn to scale.

Figure 3:
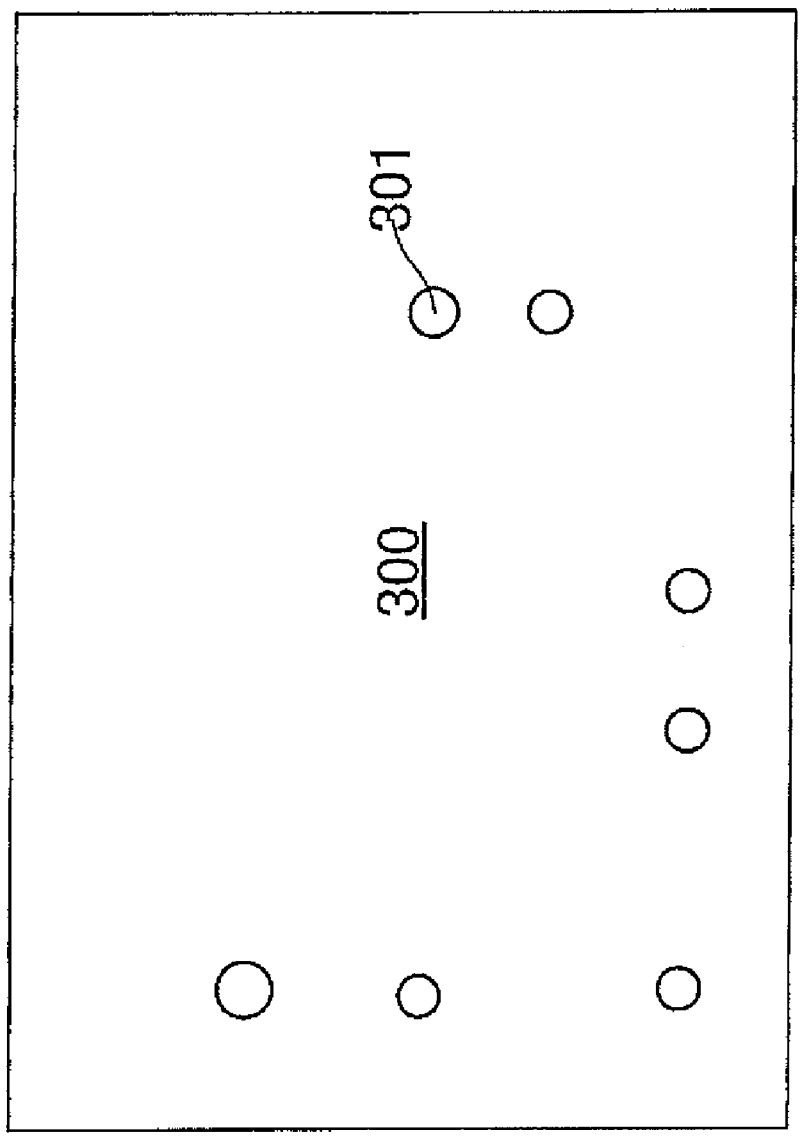
FIG. 3 depicts a top view of an insulator layer with through-hole vias which may be incorporated into a preferred embodiment of the present invention.

FIG. 3 depicts a top view of an insulator layer 300 for use in a preferred embodiment of the present invention. The insulator layer 300 may comprise any of many insulating materials, which are compatible with semiconductor processing steps, such as Mylar, Upilex, Kapton, and other films, insulating papers, resins, polyimide, glass, fiberglass, and the like, which are known in the art. Layer 300 is electrically insulating and preferably has physical characteristics compatible with certain thermal processes, such as transfer molding. Through-hole vias 301 in the insulating layer are formed at predetermined locations as detailed below, and provide a through-hole formed in the insulating layer 300. The through-hole vias can be of any size but in a preferred embodiment are around 3-10 mils in diameter and preferably about 5 mils in diameter. In a first preferred embodiment to be described, the vias are open through-holes, in other embodiments described below the vias may be filled with conductive pastes, or adhesives.

Figure 4:
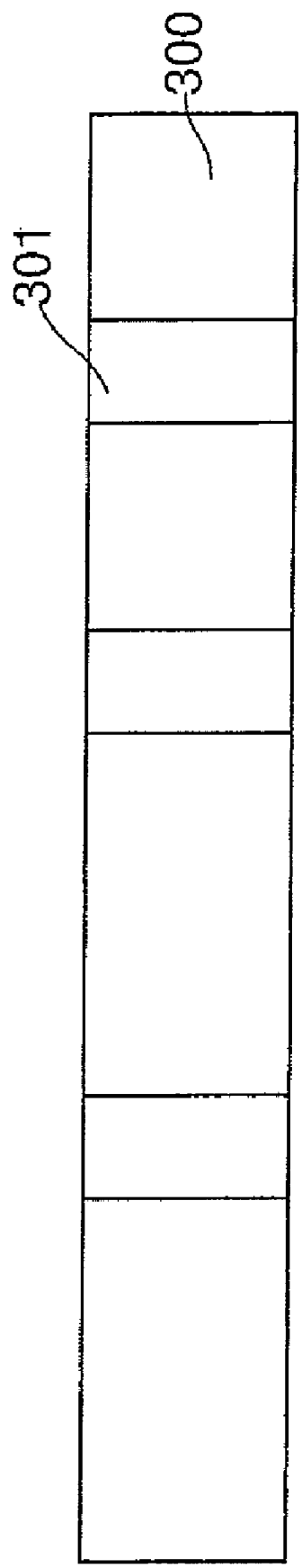
FIG. 4 depicts a cross-sectional view of the insulator layer of FIG. 3.

FIG. 4 depicts the insulating layer of FIG. 3 in a cross-sectional view. In FIG. 4, the through-hole vias 301 are shown extending through the insulating layer 300. The through-hole vias 301 may be formed by, for example, laser drilling, mechanical drilling, etching, punching or using other means to form holes in materials, such as molding. Photolithography may be used to pattern an etch resistant layer over the surface with positive or negative resists used to define the locations and dimensions of the holes, selective etch may be applied to remove the material, and then the pattern layers may be stripped away, as is known in the art.

Figure 5:
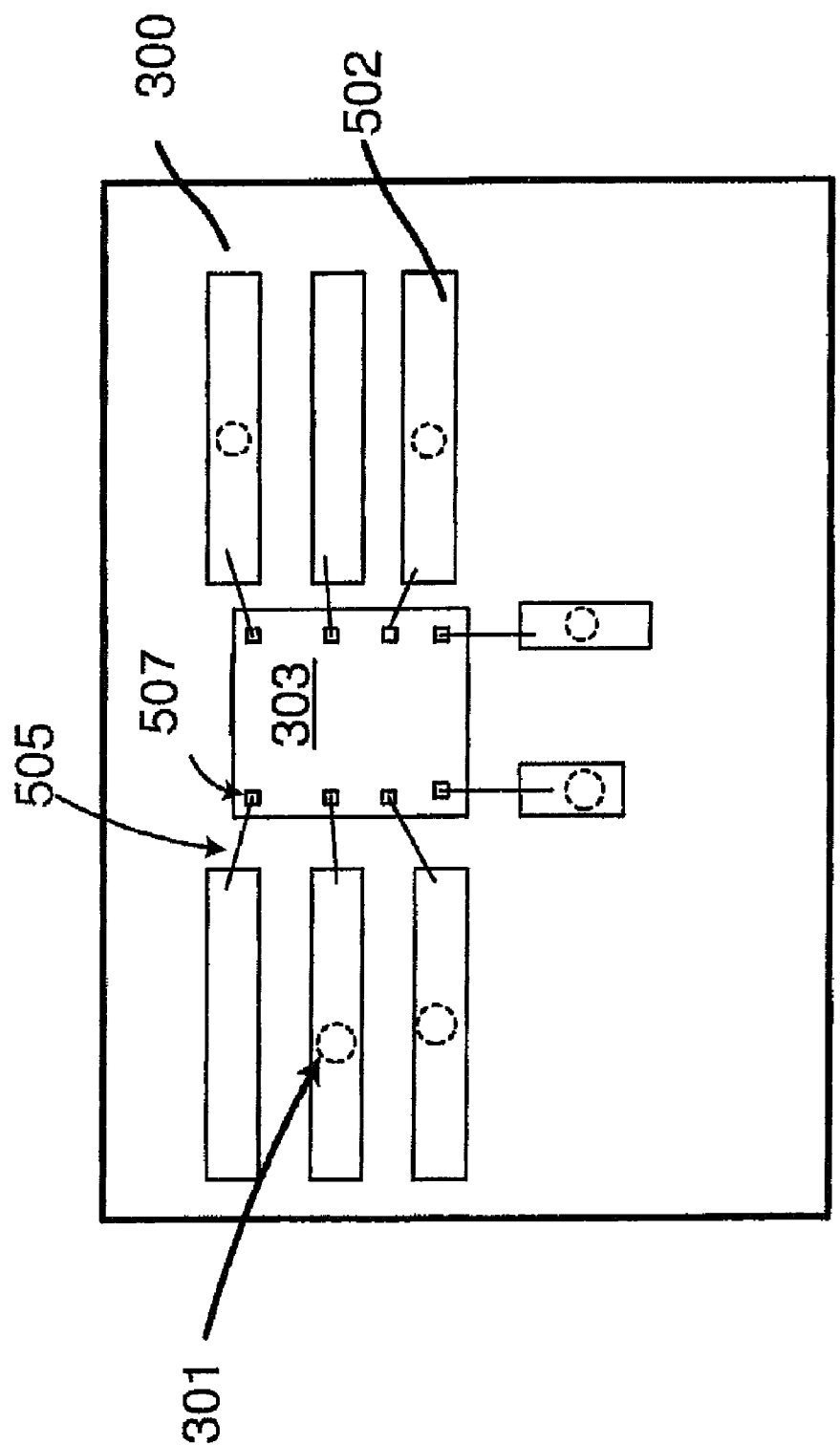
FIG. 5 depicts a top view of an insulator layer such as in FIGS. 3, 4 and having a leadframe and an integrated circuit positioned on the insulator.

FIG. 5 depicts a top view of a preferred embodiment of the invention, after a number of assembly steps have been completed. In FIG. 5, the insulator layer 300 has been provided with through-hole vias 301 formed in selected locations. A leadframe is provided with leads 502 and includes certain leads that overlie through-hole via locations 301. Integrated circuit die 303 is positioned in proximity to the interior ends of leads 502. Bond wires 505 are formed and electrically couple the bond pads 507 to the leads 502. Although not visible in the view depicted in FIG. 5, a symmetrical operation is performed to locate a second leadframe and a second integrated circuit die on the opposite surface of insulator layer 300, with some leads of the second leadframe located under the through-hole vias 301.

Figure 6:
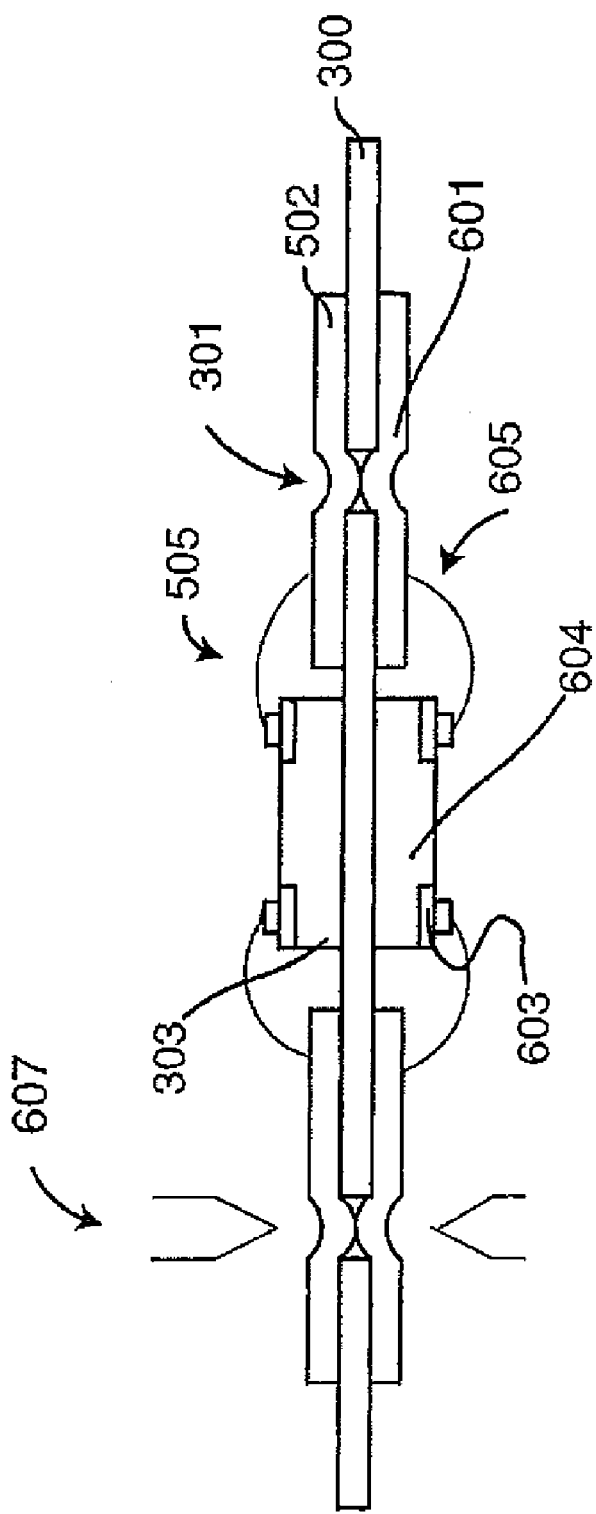
FIG. 6 depicts in a cross-sectional view the device of FIG. 5, following additional processing steps.

FIG. 6 depicts a cross-sectional view of a preferred embodiment of the invention at an intermediate stage of assembly. In FIG. 6, integrated circuit die 303 is shown positioned over a first surface of insulator layer 300. Leadframe lead 502 is shown in cross-section, and bond wires 505 are shown connecting bond pads of the integrated circuit die to leadframe leads 502. Through-hole vias 301 are shown formed in insulator layer 300 at selected locations.

Leadframe 601 is shown positioned beneath insulator layer 300 and extending beneath the through-hole vias 301. Integrated circuit die 604 is coupled from the bond pads 603 to leadframe 601 leads using bond wires 605.

As illustrated in FIG. 6, the leadframe leads may be coupled together to form a physical and electrical connection through the insulator within the through-hole via locations 301. In FIG. 6, a welding tool 607 is used to press and deform the leads 502 and 602 together in a through-hole via 301, and energy is applied to cause the two leads to become welded together. Ultrasonic, electrical and/or thermal energies may be used to form the weld, methods contemplated include using electrical resistance welding, capacitive discharge, or laser welding. In some embodiments, the leadframe leads may be coated with material before assembly to help form the weld, by spot plating or other methods. This coupling operation is performed in each through-hole via location 301. By designing the leadframes and insulator layers 300 appropriately, electrical connections can be made at any desired location between the two integrated circuits as shown in FIGS. 5 and 6.

In a preferred method, a tool such as 607 in FIG. 6 is used to form the weld between the upper and lower leadframe leads and to simultaneously form the through-hole via 301 in the insulator layer 300, that is, the insulator has no holes formed in it initially, the leadframes are positioned on either side opposing one another, and at locations where it is desired to couple the leads from the upper and lower leadframe together. In this preferred method, welding tool 607 is used to apply energy, such as heat, to the leads at a location where a connection is desired, the insulator material melts or vaporizes in response to the energy and a through-hole via 301 is formed as the insulator material is removed, the leads are physically deformed into the through-hole via 301 and are then welded together in a single continuous operation. In this method, the cost of the insulator layer is greatly reduced as no patterning or design for the insulator is required.

FIGS. 7a and 7b depict alternative methods for connecting the upper and lower leadframe leads at through-hole via locations 301 in the insulator layer 300. In FIG. 7a, a portion of an insulator layer 300 for use in a package of the invention is depicted with a through-hole via 301 filled with a conductive material 705. Conductive material, such as a conductive paste, is deposited in the through-hole vias 301 and is subsequently positioned between the leadframe leads as the assembly process continues. The conductive material completes the electrical connection between two integrated circuit devices as in FIG. 6. The conductive material may be a conductive paste screened into the vias as is known in the art, or a conductive ink, for example, a conductive ink material is available under the trade name Parmod VLT from Parelec of Rocky Hill, N.J.; and this material may be applied by screen printing, laser mill and filling, or ink jet printing processes. Heat or other energy may be applied to complete the conductive path and to physically bond the leads to the conductive material.

FIG. 7b depicts the use of an anisotropically conductive material as the insulator layer 300. This material is initially insulating in the planar horizontal and in the vertical directions. The material includes conductive filaments which, when subjected to pressure and/or heat or other energy, become conductive in a vertical direction in a selective region. Thus, in FIG. 7b, a conductive path 707 is formed at a location which lies between two leadframe leads, one for an upper leadframe and one from a lower leadframe, this conductive path is used in place of the through-hole vias 301 of FIGS. 5 and 6 to connect the leadframe leads at arbitrarily selected locations. 3M Corporation, of St. Paul, Minn., provides a pressure sensitive adhesive transfer tape that is an anisotropic conductor, 3M Tape 9703 is an example product which may be used. Anisotropic films and conductive pastes for use in embodiments such as FIG. 7b (film) or FIG. 7a (paste) are also available from other commercial vendors, such as Henkel Technologies, of Dusseldorf, Germany. These materials may be used with other films or alone to provide the insulator layer 300.

Figure 8:
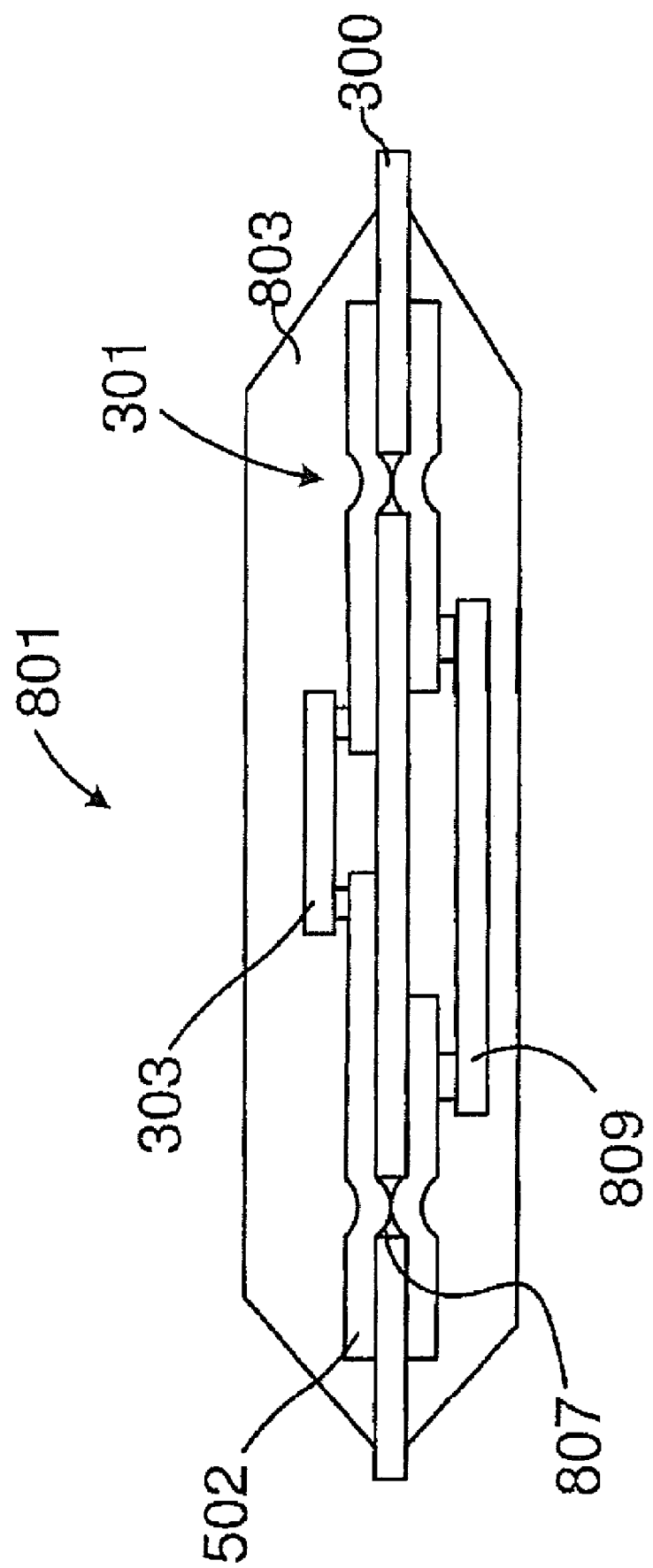
FIG. 8 depicts a cross-sectional view of a completed packaged device, which is a preferred embodiment of the invention.

FIG. 8 depicts an alternative preferred embodiment using flip chip technology to couple the integrated circuit dies to the leadframes. In FIG. 8, a package 801 is formed with encapsulant 803 overlying either side of insulator layer 300 and protecting the devices and leadframes within. Through-hole vias 301 are formed in insulator layer 300 and couple the leads 502 from the upper and lower leadframes as described above. Integrated circuit die 303, which may be a memory controller device, is flip-chip bonded to the upper leadframe by first performing a well known die or wafer bumping process which forms solder bumps, balls or columns on the die pads of the integrated circuit, the solder bumped die is then aligned with the interior ends of the leadframe leads and positioned "face down" to couple the die pads to the leadframe leads, thermal energy is used to reflow the solder and complete the connection to the leadframe. Similarly, integrated circuit 809, which may be for example a nonvolatile memory, such as a FLASH memory device, is also flip-chip mounted to the lower leadframe, and welds, such as 807, are formed to couple the upper and lower leadframes together in the through-hole vias 301. FIG. 8 also depicts the ability of the invention to make arbitrarily located connections between two or more integrated circuits within the package, the dies need not be identical or even nearly the same size.

Figure 9:
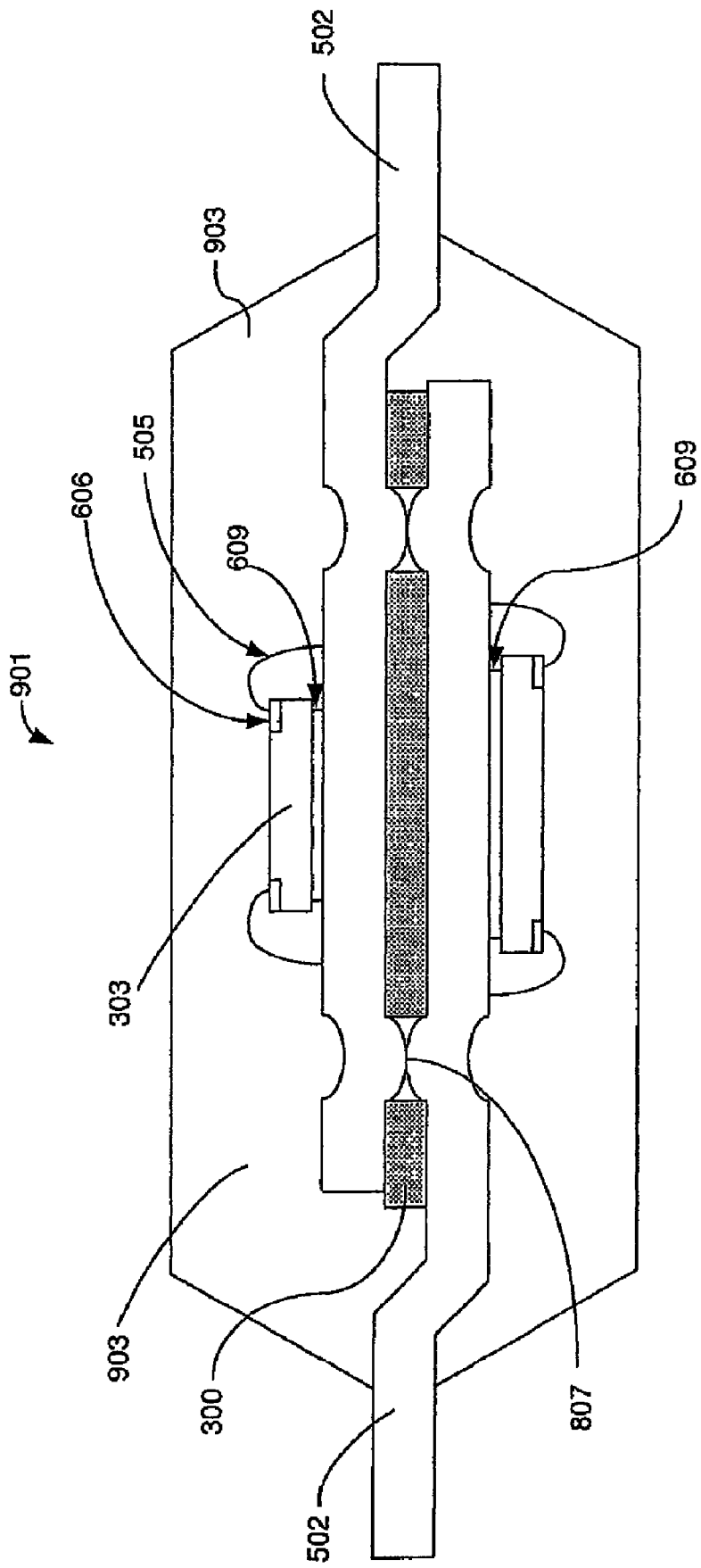
FIG. 9 depicts a cross-sectional view of another completed packaged device, which is another preferred embodiment of the invention.

FIG. 9 depicts a completed package 901 using an alternative preferred embodiment of wire bonding connections using a lead under chip or "LUC" leadframe for the upper and lower leadframes. Also in FIG. 9, the leads extend through the encapsulant boundary and provide for external connections to the package. Package 901 is depicted in cross-section with encapsulant 903 provided on either side of insulator layer 300 as before, again the encapsulant protects the integrated circuit dies, leadframes and bond wires from damage and moisture. The integrated circuit die 303 is provided overlying the leads 502 of the upper leadframe and may be advantageously mounted to the leadframe using a tape or epoxy die attach 609. Bond pads 606 of the upper and lower integrated circuits are wire bond connected to leadframe leads 502 using wire bonding as before, bond wires 505 extend and couple to the leadframe leads. Weld 807 is shown in a through-hole via 301 coupling the upper and lower leadframe leads. Leads 502 extend through the encapsulant boundary to form external terminals and to enable external connections to the package 901, for example, by use of a socket device. In this embodiment, leads from the upper leadframe emerge on one side of the package and leads from the lower leadframe emerge on another side of the package.

Figure 10:
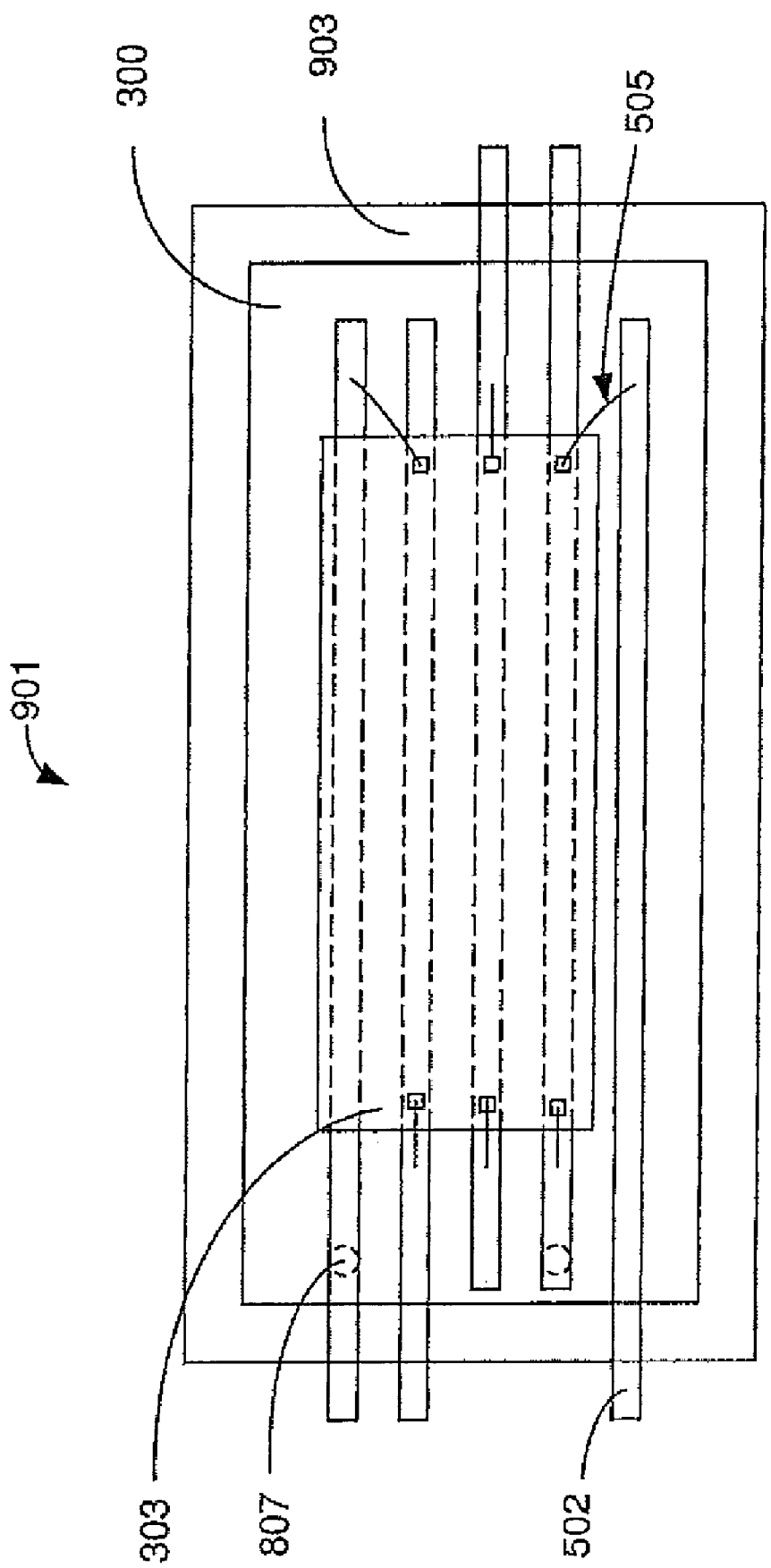
FIG. 10 depicts a top view of the device of FIG. 9.

FIG. 10 depicts the package 901 of FIG. 9 in a top view. Insulator layer 300 is shown with encapsulant 903 formed on it. Leads 502 are shown overlying insulator layer 300. Welds 807 are shown lying in vias formed underneath certain leads 502. Integrated circuit die 303 is positioned over the leads 502, so that the leadframe is a LUC or lead under chip arrangement, the die may be attached by tape or epoxy to provide support. Bond pads on the integrated circuit are coupled to the leadframe leads 520 by bond wires 505. Not visible in this view is the second integrated circuit and leadframe assembly lying underneath the insulator layer 300 and coupled to the upper leadframe by welds 807.

Figure 1B:
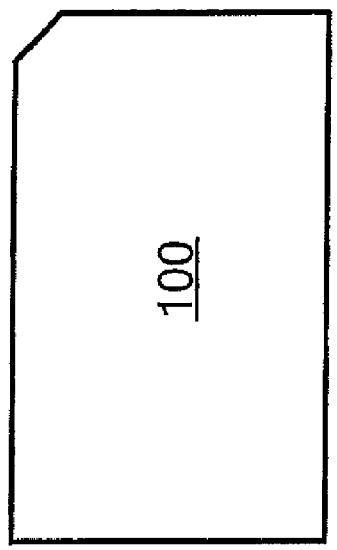
FIG. 1 depicts in a top view in FIG. 1a and in a bottom view in FIG. 1b a prior art removable storage card package.
Figure 1A:
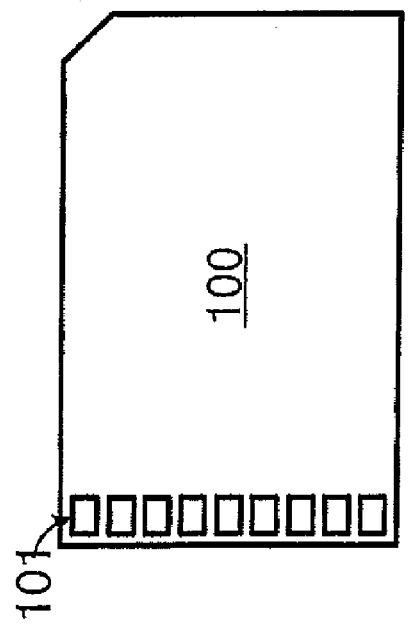
Figure 2:
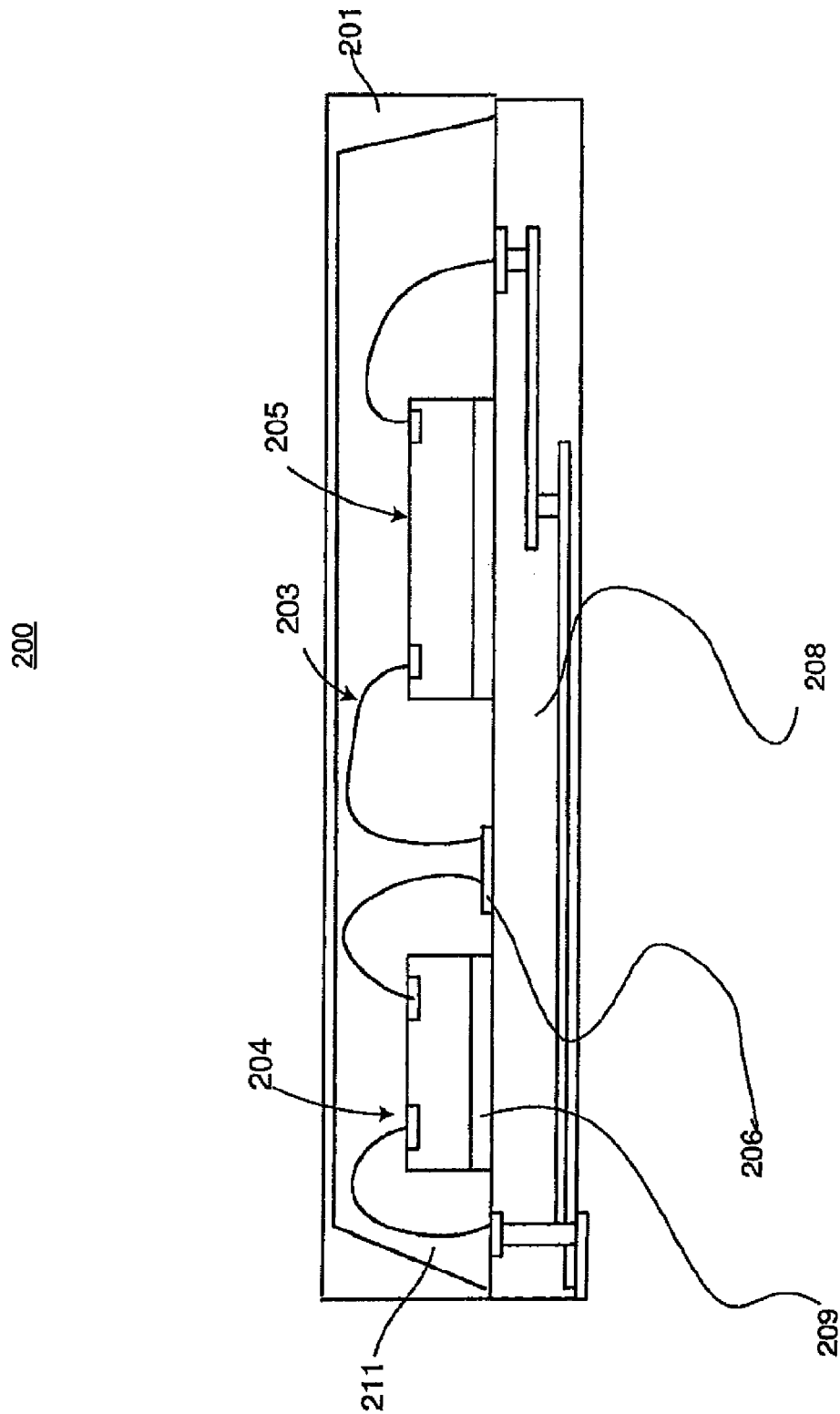
FIG. 2 depicts a cross-sectional view of a prior art removable storage card such, as is illustrated in FIG. 1, including a memory device and a controller device.
Figure 11:
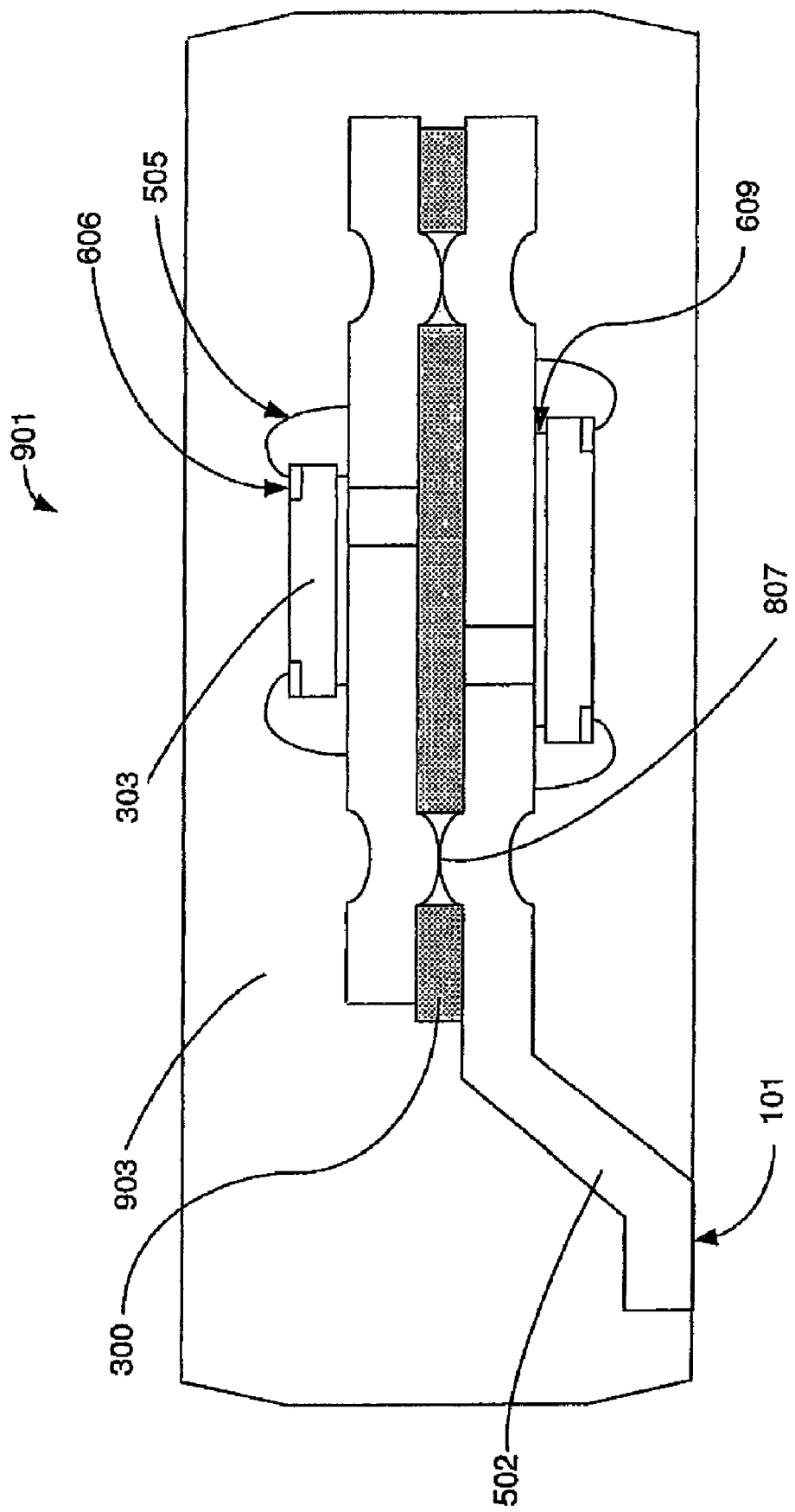
FIG. 11 depicts a cross-sectional view of another completed packaged device, which is another preferred embodiment of the invention.

FIG. 11 shows another preferred embodiment, in which some of the leads 502 are formed downward on one side of the package and the encapsulant 903 surrounds the entire assembly, but allows a region on the bottom surface 101 of selected leads 502 to be exposed for external electrical connection. These external connection regions may be positioned as shown in FIG. 1, or in other similar patterns that will be apparent to those knowledgeable in the art.

The methods for practicing the invention may be varied and these variations are contemplated as within the scope of the invention and the appended claims. For example, the leadframes and insulator layer 300 may be assembled together as a pre-formed assembly and the integrated circuit dies positioned adjacent the corresponding leadframe, wire bonding or flip-chip coupling is used to complete the connection to the dies, and then overmolding or glop top encapsulation can be performed. Alternatively, the leadframes may be provided in strip form, the integrated circuit dies may be positioned and wire bonding or flip-chip processing is performed to couple the integrated circuits to the leadframes with or without adhesives or tapes; the leadframe assemblies are then positioned over the respective opposing surfaces of the insulator layer 300, the through-hole vias 301 already provided by patterning the insulator layer 300 ahead of time, and then the leadframes are coupled together by welding, use of conductive pastes or solders, or anisotropic conductor connection as described above. Finally, the completed assembly may be overmolded or glob top encapsulated, completing the package. The insulator layer 300, as described above, may in another alternative method be provided without through-hole vias 301 formed within it, and the tooling may be used to weld and simultaneously form the through-hole vias 301 in the insulator layer 300.

Although certain preferred embodiments of the present invention and their advantages are described in detail herein, it should be understood that various changes, substitutions and alterations can be made to the embodiments described without departing from the spirit and scope of the invention as defined by the appended claims. Moreover, the scope of the present application is not intended to be limited to the particular embodiments of circuits, structures, methods and steps described in the specification. Accordingly, the appended claims are intended to include within their scope those processes, machines, manufacture, compositions of matter, means, methods, or steps which utilize the invention and those variations and medications which utilize the invention that are apparent to those skilled in the art.

What is claimed is:

1. A removable storage card, comprising:
    an insulator layer formed of an anisotropically conductive material and having a first surface and a second surface opposing the first;
    a first leadframe at least partially overlying said insulator layer and at least one lead of said leadframe overlying at least one through-hole via in said insulator layer;
    a second leadframe at least partially overlying the second surface of said insulator layer;
    a first integrated circuit electrically coupled to at least one lead of said first leadframe;
    a second integrated circuit electrically coupled to at least one lead of said second leadframe;
    the first and second leadframes being electrically connected by an electrical connection formed between the first and second leadframes by causing the anisotropically conductive material in the insulator to become electrically conductive at selected locations, whereby the first and second integrated circuits are coupled electrically.

2. The removable storage card of claim 1, wherein the anisotropically conductive material becomes electrically conductive at selected locations upon application of at least one pressure, heat or other energy.

3. The removable storage card of claim 1, wherein the anisotropically conductive material becomes electrically conductive in a direction substantially orthogonal to a plane of the insulating material in the selected locations.

4. The removable storage card of claim 1, wherein said first integrated circuit comprises a controller device.

5. The removable storage card of claim 1, wherein said second integrated circuit comprises a nonvolatile memory device.

6. The removable storage card of claim 1, wherein said second integrated circuit comprises a stacked arrangement of nonvolatile memory devices.

7. The removable storage card of claim 1, wherein the first and second integrated circuits comprise non-volatile memory devices.

8. The removable storage card of claim 1, wherein the package further comprises an encapsulant at least partially encapsulating said insulator layer, said first and second integrated circuits, and said first and second leadframes.

9. The removable storage card of claim 1, wherein said first and second integrated circuits are electrically coupled to the first and second leadframes, respectively, by bond wires.

10. The removable storage card of claim 1, wherein said first and second integrated circuits are electrically coupled to said first and second leadframes, respectively, by flip chip connection.

11. The removable storage card of claim 1, wherein said first and second integrated circuits are in back-to-back relation.

12. The removable storage card of claim 1, wherein said first and second integrated circuits are in face-to-face relation.

13. A semiconductor package, comprising:
    an insulator layer formed of selected locations of anisotropically conductive material, the anisotropically conductive material being conductive in the vertical direction upon application of energy, and the anisotropically conductive material being electrically insulative in the absence of the applied energy, the insulator layer further including a first surface and a second surface opposing the first;
    a first leadframe at least partially overlying said insulator layer and at least one lead of said leadframe overlying at least one through-hole via in said insulator layer;
    a second leadframe at least partially overlying the second surface of said insulator layer;
    a first integrated circuit electrically coupled to at least one lead of said first leadframe;
    a second integrated circuit electrically coupled to at least one lead of said second leadframe;
    the first and second leadframes being electrically connected by an electrical connection formed between the first and second leadframes upon the anisotropically conductive material becoming electrically conductive at selected locations, whereby the first and second integrated circuits are coupled electrically.

14. The semiconductor package of claim 13, wherein the energy is at least one of heat and pressure.

15. The semiconductor package of claim 13, wherein said first integrated circuit comprises a controller device.

16. The semiconductor package of claim 13, wherein said second integrated circuit comprises a nonvolatile memory device.

17. The semiconductor package of claim 13, wherein the first and second integrated circuits comprise non-volatile memory devices.

18. The semiconductor package of claim 13, wherein the package further comprises an encapsulant at least partially encapsulating said insulator layer, said first and second integrated circuits, and said first and second leadframes.

* * * * *